(12) United States Patent
Cranford, Jr. et al.

(10) Patent No.: US 6,930,506 B2
(45) Date of Patent: Aug. 16, 2005

(54) TERMINATING RESISTOR DRIVER FOR HIGH SPEED DATA COMMUNICATION

(75) Inventors: Hayden C. Cranford, Jr., Apex, NC (US); Martin B. Lundberg, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 10/065,475

(22) Filed: Oct. 22, 2002

(65) Prior Publication Data

US 2004/0075463 A1 Apr. 22, 2004

(51) Int. Cl.[7] .................. H03K 17/16; H03K 19/0175
(52) U.S. Cl. .......................... 326/30; 326/26; 326/68
(58) Field of Search ........................ 326/30, 83, 86, 326/26, 63, 68

(56) References Cited

U.S. PATENT DOCUMENTS

| | | | |
|---|---|---|---|
| 3,927,280 A | 12/1975 | Gupta et al. | |
| 4,268,723 A | 5/1981 | Taylor | |
| 4,783,643 A | 11/1988 | Dingwall | |
| 5,347,538 A | 9/1994 | Marbot | |
| 5,398,261 A | 3/1995 | Marbot | |
| 5,422,608 A | 6/1995 | Levesque | |
| 5,666,078 A | 9/1997 | Lamphier et al. | |
| 5,726,583 A | 3/1998 | Kaplinsky | |
| 6,087,847 A | 7/2000 | Mooney et al. | |
| 6,087,848 A | 7/2000 | Lin et al. | |
| 6,157,215 A | 12/2000 | Gabara et al. | |
| 6,326,821 B1 * | 12/2001 | Gabara | 327/112 |
| 6,545,560 B1 * | 4/2003 | Thompson et al. | 333/17.3 |
| 6,642,742 B1 * | 11/2003 | Loyer | 326/30 |

* cited by examiner

*Primary Examiner*—Daniel Chang
(74) *Attorney, Agent, or Firm*—McGinn & Gibb, PLLC; Richard A. Henkler, Esq.

(57) ABSTRACT

A method and structure for a driver circuit having a plurality of parallel resistors, where a total impedance of all the resistors equals an impedance of an associated transmission line and a switch adapted to combine the resistors to control an output level of the driver. The driver circuit's switch selectively connects the resistors to either a voltage high signal or a voltage low signal. The first set of the switches connect a voltage high signal to a first resistor of the resistors and a second set of switches connect a voltage low signal to a second resistor of the resistors. The switch has a matched pair of opposite type transistors. The driver circuit has balancing resistors connected to the switch, the balancing resistors are sized to balance the resistance within the driver circuit. The resistors are the balancing resistors and the drivers are connected to the switches.

17 Claims, 6 Drawing Sheets

TERMINATING RESISTOR DRIVER FOR HIGH SPEED DATA COMMUNICATION

BACKGROUND OF INVENTION

1. Field of the Invention

The present invention generally relates to high speed data communication between digital circuits that require the driver (and/or receiver) circuits be terminated with an impedance that matches the characteristic impedance of the transmission path linking the transmitter and receiver. The present invention discloses a resistor based driver that maintains a constant output impedance while allowing the control circuits to switch the output drive to the desired level.

2. Description of the Related Art

Existing drivers use current sources or voltage amplifiers (which require a certain amount of voltage overhead) to insure that the driver remains in the linear operating region of the current source or voltage amplifier. This voltage overhead increases the driver's power dissipation and decreases the maximum signal amplitude.

For example, FIGS. 1 and 2 represent conventional driver circuits that utilize current sources and/or voltage amplifiers. More specifically, FIG. 1 illustrates a current mode driver 100 that has two power supply inputs (a voltage high input VH and a voltage low input VL) and n+1 digital control inputs that control the amplitude of the output signal (VOUT). A series of current sources 101 are connected between VL and VH through switches 102 and terminating resistors 110, 111. The output impedance of the driver, $Z_0$ is equal to the value of terminating resistor 111. The current sources are selectively switched (using switches 102) between terminating resistors 110, 111 to control the amplitude of the output signal. The maximum amplitude of the output voltage is limited by the operating range (or compliance voltage range) of the current sources and the voltage drop across the switches (Vout (max)=(VH−VL)−($V_{101}$(min)+$V_{102}$)). The additional voltage needed for proper operation of the current sources ($V_{101}$(min)) and switches ($V_{102}$) results in increased power dissipation and limits the maximum output signal for any given VH and VL. Item 120 represents the transmission line and item 121 represents its terminating impedance 121.

FIG. 2 illustrates a conventional voltage mode driver 200 that includes an amplifier 201 and a terminating resistor 202. The amplifier has two power supply inputs (VH and VL) and an analog control input signal Vin that controls the amplitude of the output voltage VOUT. The output impedance of the driver, $Z_0$ is equal to the value of terminating resistor 202. A transistor level implementation of the amplifier 201 consists of a control block 205, and two driving transistors 203, 204. Since the amplifier must remain in its linear operating region to function as an amplifier, its output voltage range must be less than the supply voltages (i.e., VAMP(max)=VH−$V_{203}$(min) and VAMP(min)=VL+$V_{204}$(min)). The maximum signal amplitude is therefore VOUT(max)=VAMP(max)−VAMP(min)=VH−VL−($V_{203}$(min)+$V_{204}$(min)). This occurs because the driving transistor 203 loses its ability to control the output voltage as VH−VAMP approaches zero and transistor 203 loses its ability to control the output voltage as VAMP−VL approaches zero. The difference between the output range of the amplifier (VAMP(max)−VAMP(min)) and the power supply range (VH−VL) is the driver's voltage overhead ($V_{203}$(min)+$V_{204}$(min)) that results in increase power dissipation and limits the signal amplitude. In addition, the bias currents that are necessary for the control circuits 205 also add additional power consumption. Driver 200 maintains a specific output impedance by inserting a terminating resistor 202 in series with the amplifier 201. An amplifier has a low output impedance. Problems associated with these structures are power dissipation and limitations on maximum signal amplitude.

SUMMARY OF INVENTION

In view of the foregoing and other problems, disadvantages, and drawbacks of the conventional driver circuits the present invention has been devised, and it is an object of the present invention to provide a structure and method for an improved driver circuit having resistors in parallel to control impedance and signal amplitude.

In order to attain the object(s) suggested above, there is provided, according to one aspect of the invention a driver circuit having a plurality of parallel resistors, where a total impedance of all the resistors equals an impedance of an associated transmission line. The invention includes a switch that is adapted to combine the resistors to control an output level of the driver. The driver circuit's switch selectively connects the resistors to either a voltage high signal or a voltage low signal. In one embodiment, a first set of the switches connect a voltage high signal to a first resistor and a second set of switches connect a voltage low signal to a second resistor. The switch can be a matched pair of opposite type transistors. The driver circuit can have balancing resistors connected to the switch, the balancing resistors are sized to balance the resistance within the driver circuit. The invention can also include drivers connected to the switches.

BRIEF DESCRIPTION OF DRAWINGS

The foregoing and other objects, aspects and advantages will be better understood from the following detailed description of a preferred embodiment(s) of the invention with reference to the drawings, in which.

DETAILED DESCRIPTION

As mentioned above, there is a need to provide a driver circuit that has a specific impedance matching the impedance of the transmission line, that neither consumes large quantities of power nor decreases maximum signal amplitude. The invention overcomes the conventional problems and provides a driver that matches the necessary impedance with minimum power dissipation and maximum signal amplitude by utilizing a number of resistors in parallel. More specifically, FIG. 3 illustrates one embodiment of the invention.

Figure 3:
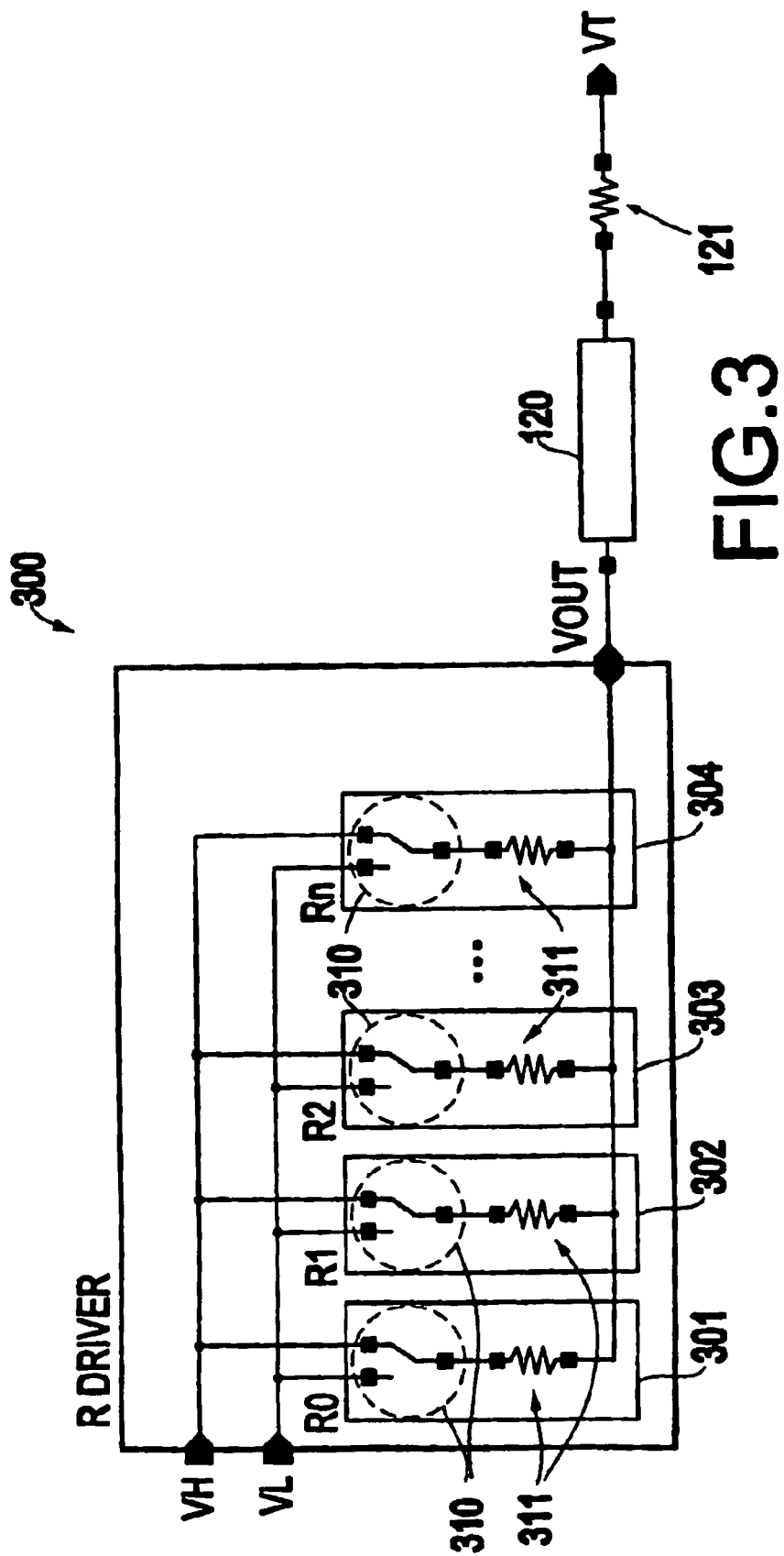
FIG. 3 is a schematic diagram of a driver circuit according to the invention.

In FIG. 3, the driver circuit 300 and the resistor switch segments are shown as items 301–304. Each switch segment 301–304 includes a switch 310 and a resistor 311. The switches 310 switch between VH and VL and pass the signal through the resistor 311. While there are a limited number of resistive elements shown in the drawings, one ordinarily skilled in the art would understand that the number of resistive elements is not limited and depend upon the specific design being addressed. The driver consists of a number of switch-resistor combinations with one end connected to the output node of the driver. The opposite end can be switched between a high and low voltage reference level, typically VDD (VH) and GND (VL).

Figure 4:
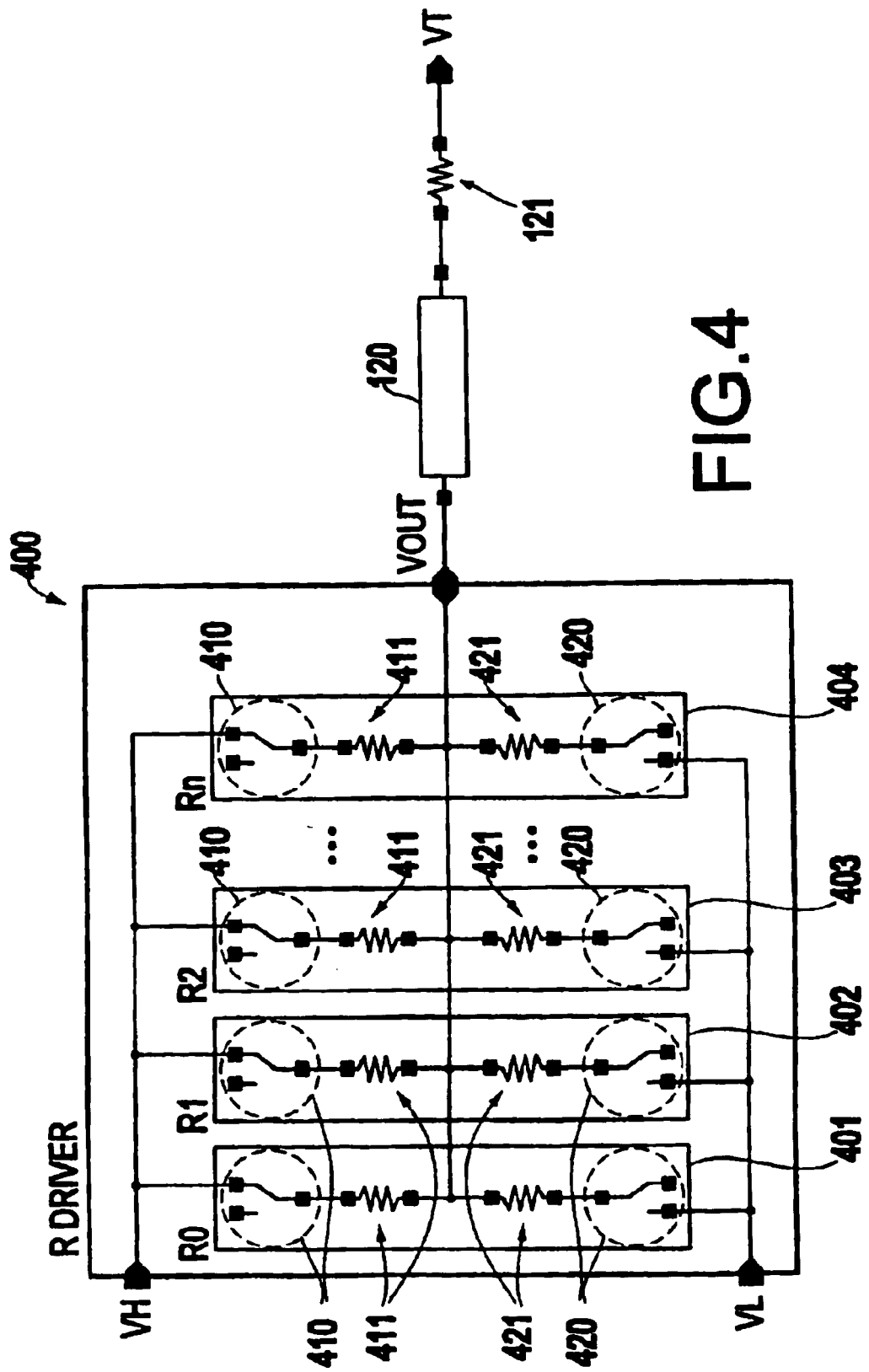
FIG. 4 is a schematic diagram of a driver circuit according to the invention.

FIGS. 3 and 4 illustrate two implementations of the inventive driver. Each driver is composed of n resistor-switch segments (note: the resistor-switch segments do not have to be identical; they may have different values of resistance). The resistor-switch segments in FIG. 3 show a single resistor that is switched between VL and VH. The resistor-switch segments in FIG. 4 show two equal resistors that are switched, one to VH and the second to VL.

In general, the resistive elements do not increase power dissipation or decrease signal amplitude because the output impedance of the driver ($Z_o$) is equal to the parallel combination of all the resistive elements ($Z_o=1/(1/R_0+1/R_1+\ldots+1/R_n)$). It does not matter whether a resistive element is switched to either the VH or VL supply input. If all the resistive elements are connected to VH, then VDRIVE(max)=VH and if all the resistive elements are connected to VL, then VDRIVE(min)=VL. The maximum signal amplitude is therefore Vout(max)=Vdrive(max)−Vdrive(min)=VH−VL.

Figure 1:
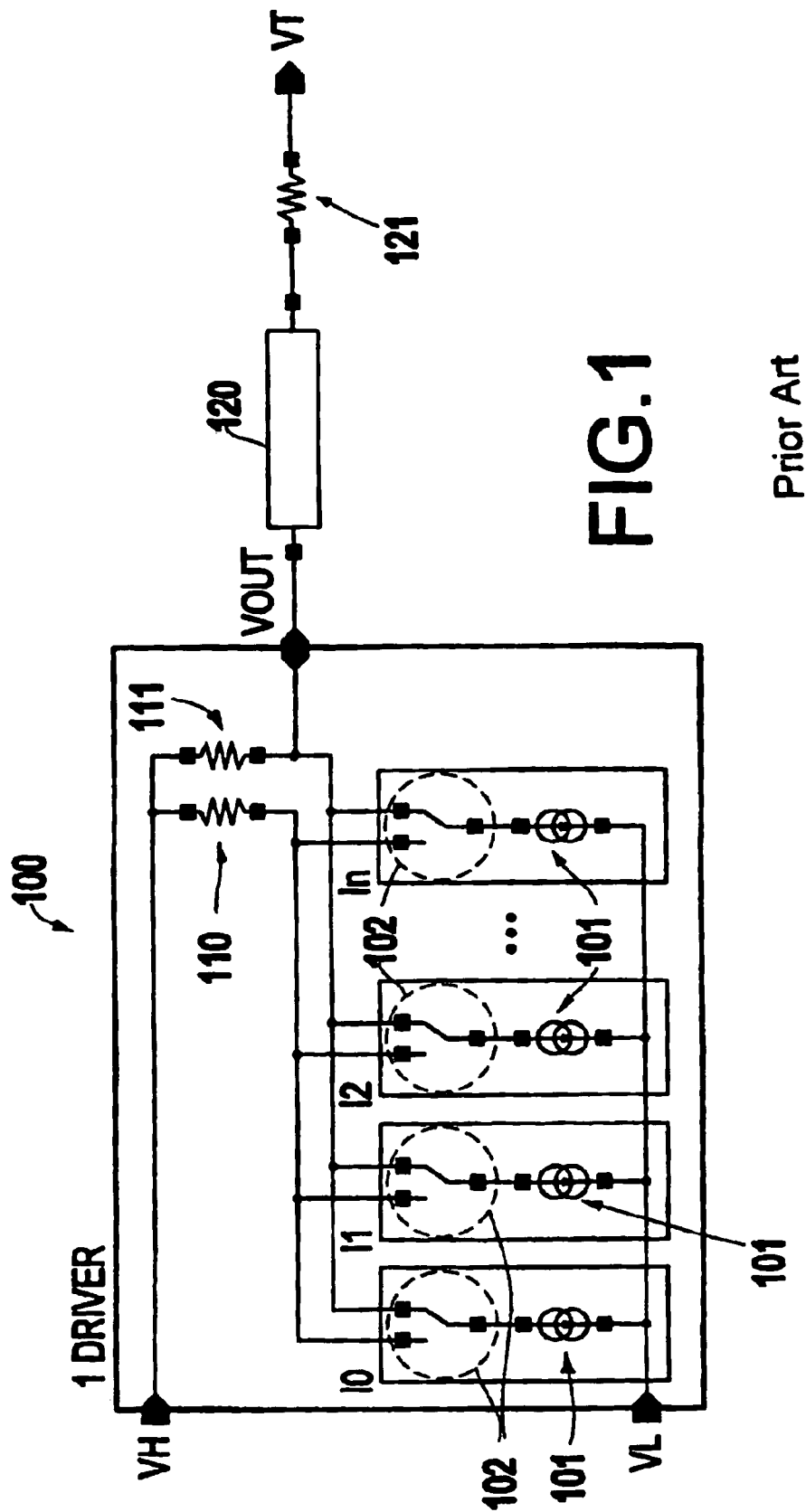
FIG. 1 is a schematic diagram of a conventional current mode driver circuit.
Figure 2:
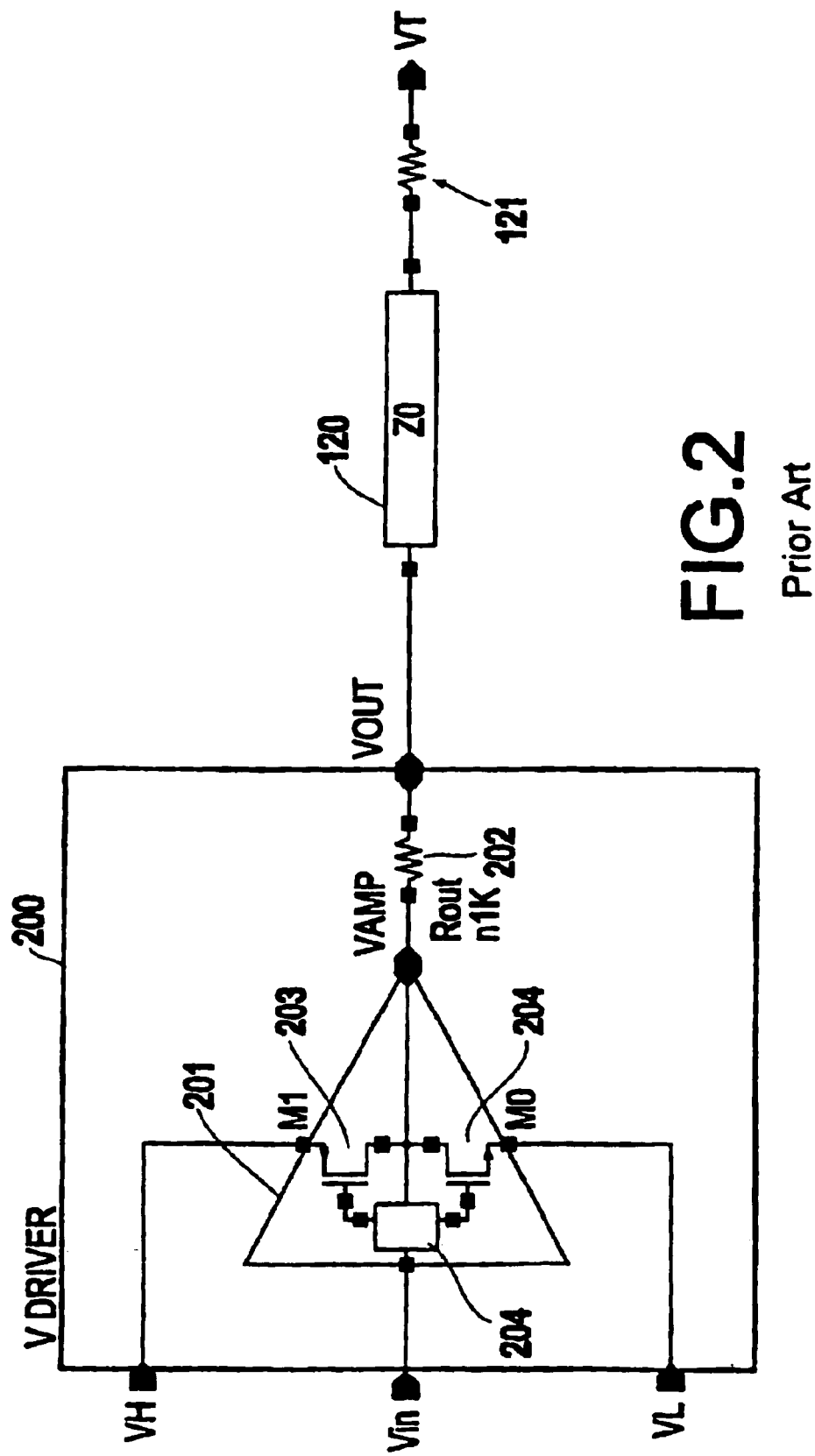
FIG. 2 is a schematic diagram of a conventional voltage mode driver circuit.

In FIG. 1, Vout(max) (VH−VL)−($V_{101}$(min)+$V_{102}$). In FIG. 2, Vout(max)=VAMP(max)−VAMP(min)=(VH−VL)−($V_{203}$(min)+$V_{204}$(min)). In FIGS. 3 and 4, Vout(max)=(VH−VL). If VH and VL are fixed then Vout(max) is reduced by ($V_{101}$(min)+$V_{102}$) for FIG. 1, or Vout(max) is reduced by ($V_{203}$(min)+$V_{204}$(min)) for FIG. 2. If Vout(max) is held constant then VH−VL must be increased by ($V_{101}$(min)+$V_{102}$) for FIG. 1, or VH−VL must be increased by ($V_{203}$(min)+$V_{204}$(min)) for FIG. 2. This increase in VH−VL results in increased power dissipation.

With the invention the parallel combination of all the resistors is equal to the characteristic impedance of the transmission line. Since the reference voltage levels represent a virtual ground for AC analysis, the output impedance of the driver is always equal to the parallel combination of all the resistors $$1/R_0+1/R_1 30\ 1/R_2+\ldots+1/R_n+1/Z_0$$

The output level of the driver is controlled by switching selected resistors between the high and low reference level such that the parallel-series combination generates the appropriate output voltage.

$$VOUT=VL+(VH-VL)*[R_H/(R_H+R_L)]R_H$$

$R_H$ is the parallel combination of resistors switched to VH.

$R_L$ is the parallel combination of resistors switched to VL.

For example in FIG. 3, if resistor 311 is connected to VH in resistor-switch segments 301 and 302, and resistor 311 is connected to VL in resistor-switch segments 303–304. Then $$R_H=1(1/R_{301}+1/R_{302}) \text{ and } RL=1/(1/R_{303}+\ldots+1/R_{304}).$$

Regardless which resistors are connected to VH and which resistors are connected to VL the output impedance of the driver remains the same.

$$1/R_H+1/R_L=1/R_0+1/R_1+1/R_2+\ldots+1/R_n=1/Z_0$$

$$1/R_H+1/R_L=(1/R_{301}+1/R_{302})+(1/R_{303}+\ldots+1/R_{304})=1/Z_0$$

The values of each resistor can be selected in any way to determine the appropriate resolution and step size of the output voltage. The resistors do not have to be the same value.

The conventional structures shown in FIGS. 1 and 2 both require the use of transistors in their saturated operating regions since they are used as linear control devices. In one embodiment, the invention uses transistors to implement the switch function; however these transistors are used in the linear or triode operating regions. The invention is not required to use linear control devices. In other words, the invention is a switch mode driver rather than a linear controlled driver.

In FIG. 1, the amplitude of the signal is controlled by the digital switch settings and the value of the current sources. The sum, of all the current sources times the value of the terminating resistor 111 determines the maximum signal amplitude for the conventional structure shown in FIG. 1. In FIG. 2, the amplitude of the signal is controlled by an analog input signal and the gain of the amplifier. If the amplitude of the signal generated by the circuit shown in FIG. 2 is to be controlled with a digital control, then a digital-to-analog converter must be used to generate the analog input signal. To the contrary, with the invention, the maximum signal amplitude is always equal to VH−VL, without the need to scale the value of the current source to match the value of the terminating resistor (FIG. 1) or the need to have a digital-to-analog converter that generates an analog signal that is compatible with the amplifier gain and input levels (as is needed in the circuit shown in FIG. 2). The relative amplitude is controlled by the digital control of the switches, which is an integral part of the driver design.

FIG. 4 illustrates another embodiment of the inventive driver 400 that includes resistance elements 401–404. Items 401–404 represent resistors that each include upper switches 410 and lower switches 420 and are connected to the signal line 120, 121. The upper switches 410 connect or disconnect the VH signal (which is passed through resistors 411). Similarly, the lower switches 420 pass the VL signal through resistors 421 to the signal line 120, 121.

The resistor-switch segments in FIG. 3 require only one switch and one resistor. But, the switch must be able to switch the resistor between the two supply rails (single pole double throw (spdt) function), and the switch must be able to sink and source current. The parasitic capacitance on the switching node is rapidly charged or discharged through the low impedance of the switch. To the contrary, the resistor-switch segments in FIG. 4 require two switches and two resistors. However, the switch is only required to switch the resistor between one supply rail and an open circuit (single pole single throw (spst) function), and the switch is only required to sink or source current, not both. As a result, the switch design in the embodiment shown in FIG. 4 can be simpler than that shown in FIG. 3.

With the embodiments shown in FIGS. 3 and 4, since there is one resistor associated with each switch, the values of each resistor can be tailored to match the resistance of the respective switch, so that the sum of the resistance of the switch and the resistor combine to achieve the desired value. The parasitic capacitance of the switching node must be charged or discharged through the resistor when the switch is in the open state. This results in lower current peaks than with the circuits shown in FIG. 1.

Figure 7:
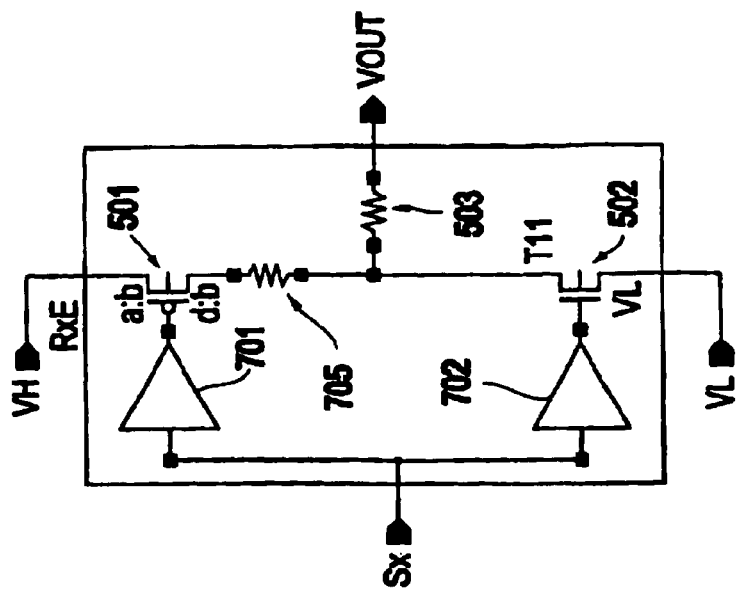
FIG. 7 is a schematic diagram of a driver circuit according to the invention.
Figure 6:
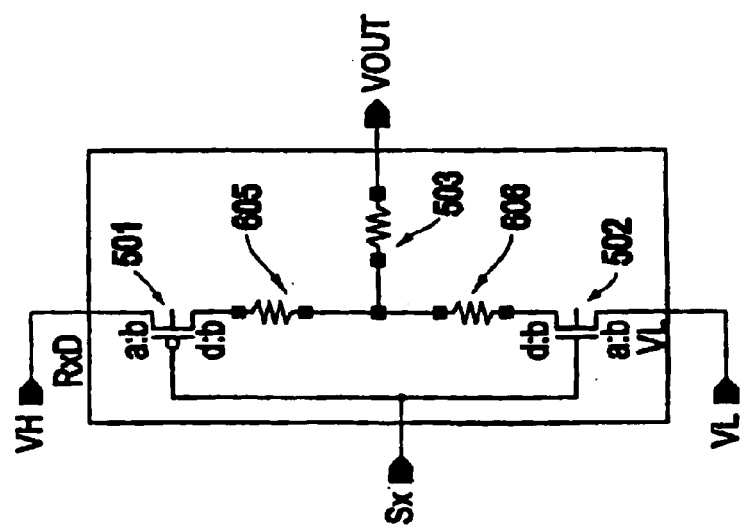
FIG. 6 is a schematic diagram of a driver circuit according to the invention.
Figure 5:
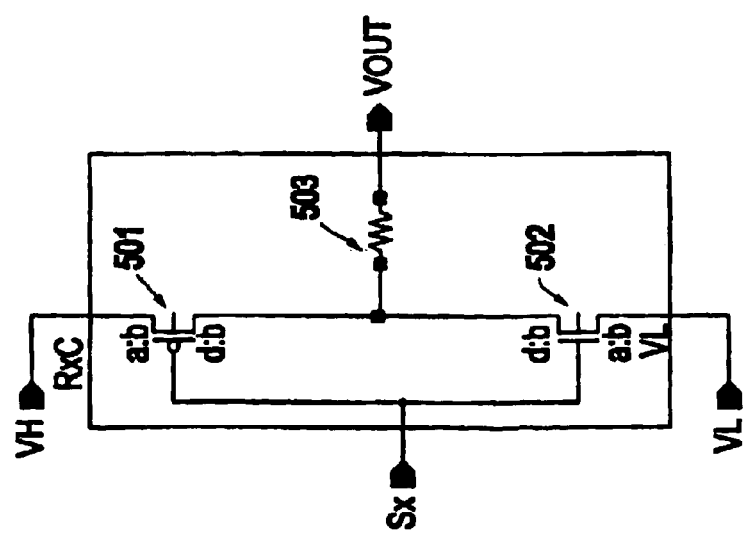
FIG. 5 is a schematic diagram of a driver circuit according to the invention.
Figure 10:
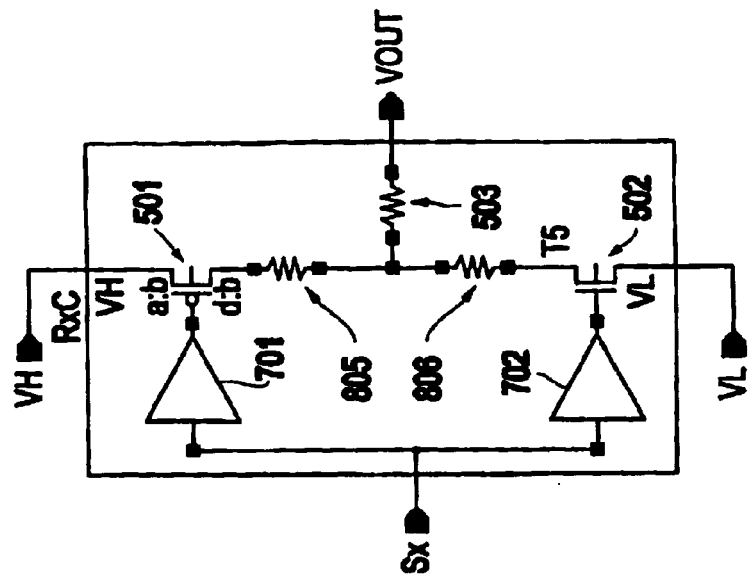
FIG. 10 is a schematic diagram of a driver circuit according to the invention.
Figure 9:
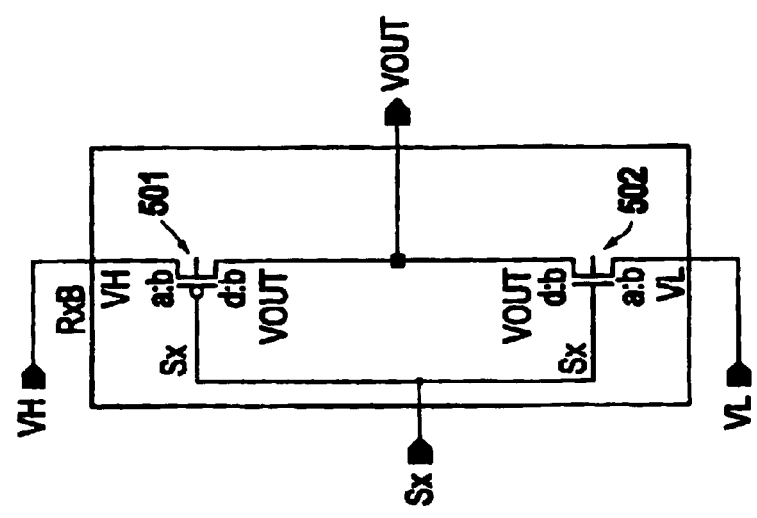
FIG. 9 is a schematic diagram of a driver circuit according to the invention.
Figure 8:
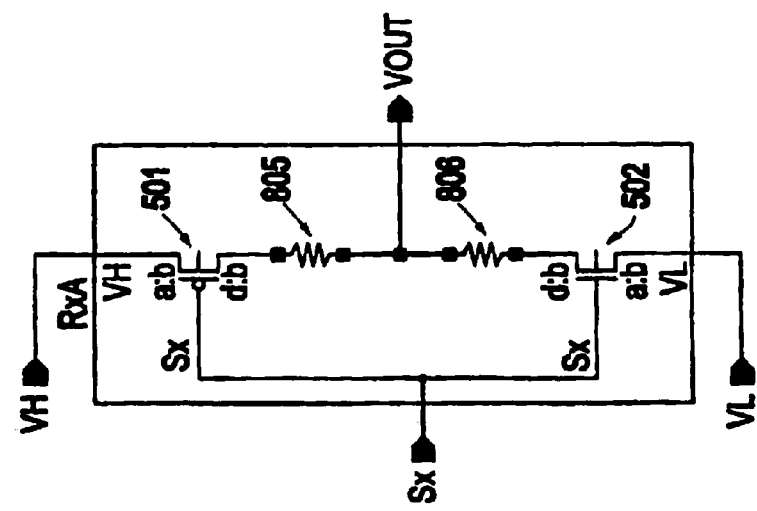
FIG. 8 is a schematic diagram of a driver circuit according to the invention.

The resistor-switch segments shown in FIGS. 5–7 are similar to the resistor switch segments 301–304 shown in FIG. 3 and the resistor-switch segments shown in FIGS. 8–10 are similar to the resistor-switch segments 401–404 shown FIG. 4. More specifically, transistors 501, 502 connect either the VH signal or the VL signal to an output through a resistor 501. Preferably, the transistors 501, 502 are of a different type so that a single signal Sx can be utilized to simultaneously deactivate one transistor while the other transistor is activated. For example, transistor 501 is shown as a P-type transistor and transistor 502 is shown as a N-type transistor.

The resistor-switch segments shown in FIG. 6 are similar to that shown in FIG. 5 except that the ones in FIG. 6 include additional resistors 605, 606. These resistors 605, 606 are selected to balance the resistance of each leg in the segment. For example, the P-type transistor 501 has a different resistance than the N-type transistor 502 and the resistors 605, 606 are sized to accommodate for this difference.

The resistor switch segment shown in FIG. 7 is similar to the previous switch segments and includes buffers 701, 702 and a balancing resistor 705. Having separate buffers 701 and 702 allows the gate drive signals for 501 and 502 to be optimized so that the signal to turn on one of the transistors is delayed until the other transistor is turned off, thus minimizing shoot-through current spikes that occur when both transistors are simultaneously turned on. The use of resistor 705 is used to balance the switch resistance similarly to resistors 605 and 606.

The resistor-switch segment shown in FIG. 8 is similar to the structure shown in FIG. 6; however, in FIG. 8, the resistor 503 is omitted and the balancing resistors 805, 806 provide the majority of resistance of the device. The resistor switch segments shown in FIG. 9 are similar to that shown in FIG. 8 but omit the resistors 805, 806, relying primarily upon the transistors 501, 502 to provide a resistance. The resistor switch segment shown in FIG. 10 is similar to that shown in FIG. 8; however it includes the drivers 701, 702 that are discussed above with respect to FIG. 7.

In FIGS. 5–10, the resistance of the switching transistors is included in total resistance value of the resistor-switch segment, and the values of the resistor and switch resistance can be optimized for maximum performance. In the limiting case (See FIG. 9, R×B), the switch can provide the total resistance. A switch driver can be included (See FIG. 10, R×C and FIG. 7 R×E) that provides adjustable drive levels to the transistor gates to provide better control of the on resistance of the transistor switches over process and temperature variations.

Thus, as shown above the invention overcomes the conventional problems and provides a driver that matches the necessary impedance with minimum power dissipation and maximum signal amplitude by utilizing a number of resistors in parallel.

While the invention has been described in terms of preferred embodiments, those skilled in the art will recognize that the invention can be practiced with modification within the spirit and scope of the appended claims.

What is claimed is:

1. A driver circuit comprising:

a plurality of parallel resistors, wherein a total impedance of all said resistors always equals an impedance of an associated transmission line;

a switch adapted to combine said resistors to control an output level of said driver; and balancing resistors connected to said switch, wherein said balancing resistors are sized to balance the resistance within said driver circuit.

2. The driver circuit in claim 1, wherein said switch selectively connects said resistors to either a voltage high signal or a voltage low signal.

3. The driver circuit in claim 1, wherein a first set of said switches connect a voltage high signal to a first resistor of said resistors and a second set of switches connect a voltage low signal to a second resistor of said resistors.

4. The driver circuit in claim 1, wherein said switch comprises a matched pair of opposite type transistors.

5. The driver circuit in claim 1, wherein said resistors are said balancing resistors.

6. The driver circuit in claim 1, further comprising drivers connected to said switches.

7. A driver circuit connected to a transmission line, said driver circuit comprising:

a plurality of parallel resistors, wherein a total impedance of all said resistors always equals an impedance of said transmission line;

a plurality of switches, each connected to one of said resistors, said switches being adapted to combine said resistors to control an output level of said driver; and balancing resistors connected to said switches, wherein said balancing resistors are sized to balance the resistance within said driver circuit.

8. The driver circuit in claim 7, wherein each of said switches selectively connects one of said resistors to either a voltage high signal or a voltage low signal.

9. The driver circuit in claim 7, wherein a first set of said switches connect a voltage high signal to a first resistor of said resistors and a second set of said switches connect a voltage low signal to a second resistor of said resistors.

10. The driver circuit in claim 7, wherein each of said switches comprises a matched pair of opposite type transistors.

11. The driver circuit in claim 8, wherein said resistors are said balancing resistors.

12. The driver circuit in claim 7, further comprising drivers connected to said switches.

13. A driver circuit connected to a transmission line, said driver circuit comprising:

a plurality of parallel resistive segments, wherein a total impedance of all said resistive segments always equals an impedance of said transmission line, wherein each of said resistive segments includes two resistors and switches connected to said resistive segments, wherein said switches are adapted to combine said resistors to control an output level of said driver; and balancing resistors connected to said switches, wherein said balancing resistors are sized to balance the resistance within said driver circuit.

14. The driver circuit in claim 13, wherein said switches selectively connect said resistors to either a voltage high signal or a voltage low signal.

15. The driver circuit in claim 13, wherein a first set of said switches connect a voltage high signal to a first resistor of said resistors and a second set of switches connect a voltage low signal to a second resistor of said resistors.

16. The driver circuit in claim 13, wherein each of said switches comprises a matched pair of opposite type transistors.

17. The driver circuit in claim 13, further comprising drivers connected to said switches.

* * * * *